(12) United States Patent
Dreps et al.

(10) Patent No.: US 9,536,604 B1
(45) Date of Patent: Jan. 3, 2017

(54) IMPEDANCE MATCHING SYSTEM FOR DDR MEMORY

(71) Applicant: International Business Machines Corporation, Armonk, NY (US)

(72) Inventors: Daniel M. Dreps, Georgetown, TX (US); Keenan W. Franz, Austin, TX (US); Nam H. Pham, Round Rock, TX (US); Lloyd A. Walls, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/989,553

(22) Filed: Jan. 6, 2016

(51) Int. Cl.
  *G11C 11/00* (2006.01)
  *G11C 13/00* (2006.01)

(52) U.S. Cl.
  CPC ....... *G11C 13/0002* (2013.01); *G11C 13/0004* (2013.01); *G11C 13/004* (2013.01); *G11C 13/0007* (2013.01); *G11C 13/0069* (2013.01)

(58) Field of Classification Search
  CPC ............. G11C 13/0069; G11C 13/0004; G11C 13/004; G11C 13/0007
  USPC ............................................ 365/148, 233.13
  See application file for complete search history.

(56) References Cited

U.S. PATENT DOCUMENTS

| | | | | |
|---|---|---|---|---|
| 6,125,419 | A * | 9/2000 | Umemura | G06F 13/4086 710/110 |
| 6,970,369 | B2 * | 11/2005 | Funaba | G11C 5/063 365/230.03 |
| 7,529,112 | B2 * | 5/2009 | Dreps | G11C 5/04 365/51 |
| 7,646,212 | B2 * | 1/2010 | Sung | G11C 5/04 326/30 |
| 8,195,855 | B2 * | 6/2012 | Jeong | G06F 13/4086 323/224 |
| 9,082,464 | B2 * | 7/2015 | Sung | G11C 5/04 |
| 2013/0128375 | A1 | 5/2013 | Livshitz et al. | |
| 2014/0002130 | A1 | 1/2014 | Jang | |
| 2014/0312488 | A1 | 10/2014 | Fukuda | |
| 2014/0320229 | A1 | 10/2014 | Ali | |

FOREIGN PATENT DOCUMENTS

| | | |
|---|---|---|
| DE | 10125597 A1 | 12/2002 |
| JP | 11055046 A | 2/1999 |
| JP | 2004021916 A | 1/2004 |
| WO | 2012115288 A1 | 8/2012 |

OTHER PUBLICATIONS

Shin, Woo-Yeol et al., 4-Slot, 8-Drop Impedance-Matched Bidirectional Multidrop DQ Bus With a 4.8-Gb/s Memory Controller Transceiver, IEEE Transactions on Components, Packaging and Manufacturing Technology, vol. 3, No. 5, May 2013, pp. 858-869, IEEE, Piscataway, United States.

* cited by examiner

*Primary Examiner* — Pho M Luu
(74) *Attorney, Agent, or Firm* — Patterson + Sheridan, LLP

(57) ABSTRACT

A memory system is deigned for impedance matching using a network of resistors that are tuned to reduce reflections on a shared bus. Any deviation from the matched state causes a mismatch and results in reflections on the bus. Overall signal reflections are reduced by balancing the back reflections occurring at a connector junction coupled to a pair of resistors and the back reflections occurring at the input of the DIMMs. This balance or tradeoff is achieved by changing the resistance value of the resistor pair to reduce the overall back reflections in the memory system.

17 Claims, 5 Drawing Sheets

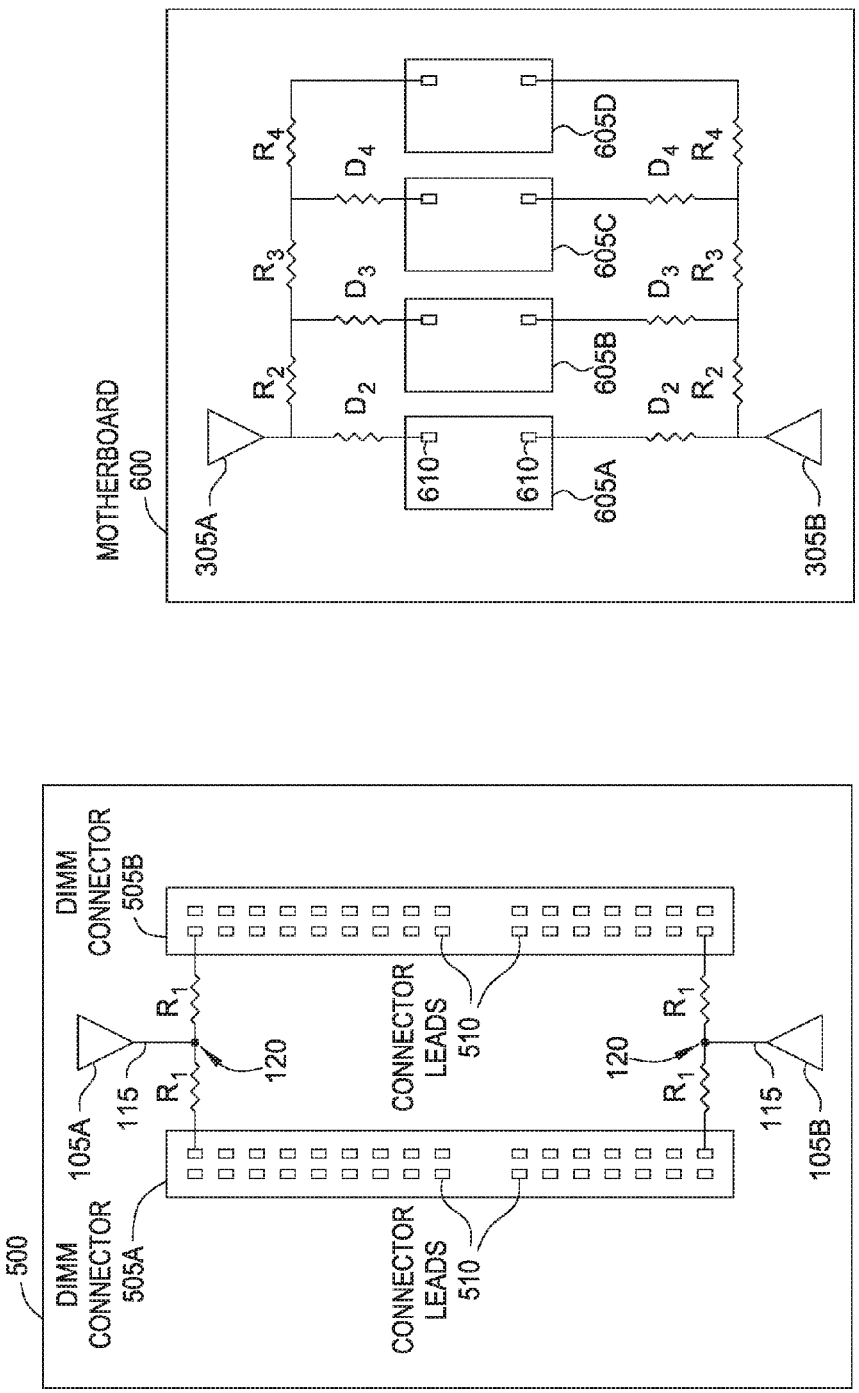

IMPEDANCE MATCHING SYSTEM FOR DDR MEMORY

BACKGROUND

The present invention relates to impedance matching in DDR memory, and more specifically, to adjusting resistances between a driver and memory modules.

The design of a computing system is limited by the number of dual in-line memory modules (DIMM) that can be addressed on a single bus. Reflections increase as additional DIMMs are placed on a bus which shrinks the size of the useful data eye required for the receiving DIMM to process the signals. Current double data rate (DDR) registered DIMMs are limited in speed due to this configuration.

SUMMARY

According to one embodiment of the present invention, a memory system includes a driver and a conductive trace coupled to an output of the driver at a first end and to a connector junction at a second end. The memory system includes a first discrete resistor coupled to the connector junction at a first end and a first connector lead at a second end where the first connector lead is configured to couple to a first memory module and a second discrete resistor coupled to the connector junction at a first end and a second connector lead at a second end where the second connector lead is configured to couple to a second memory module. Moreover, resistive values of the first and second resistors are the same and the resistive values of the first and second resistors result in back reflections at the connector junction when the driver transmits a signal to the first and second connector leads.

Another embodiment of the present invention is a memory system that includes a driver and a conductive trace coupled to an output of the driver at a first end and to a connector junction at a second end. The memory system includes a first discrete resistor coupled to the connector junction at a first end and a first connector lead at a second end where the first connector lead is configured to couple to a first memory module and a second discrete resistor coupled to the connector junction at a first end and a second connector lead at a second end where the second connector lead is configured to couple to a second memory module. Moreover, resistive values of the first and second resistors are the same and the resistive values of the first and second resistors are less than an inherent resistance of a second conductive trace coupling the second end of the first resistor to the first connector lead.

Another embodiment of the present invention is a memory system that includes a substrate. The substrate includes a driver and a conductive trace coupled to an output of the driver at a first end and to a connector junction at a second end. The substrate also includes a first discrete resistor coupled to the connector junction at a first end and a first connector lead at a second end where the first connector lead is disposed in a first DIMM connector and a second discrete resistor coupled to the connector junction at a first end and a second connector lead at a second end where the second connector lead is disposed in a second DIMM connector. Moreover, resistive values of the first and second resistors are the same, wherein the resistive values of the first and second resistors result in back reflections at the connector junction when the driver transmits a signal to the first and second DIMM connectors. The memory system also includes a first memory module inserted into the first DIMM connector and a second memory module inserted into the second DIMM connector.

BRIEF DESCRIPTION OF THE SEVERAL VIEWS OF THE DRAWINGS

FIGS. 5A and 5B illustrate a motherboard with multiple DIMM connectors, according to one embodiment described herein.

FIG. 6 is a motherboard with multiple DIMM connectors, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe a memory system for impedance matching using a network of resistors that are tuned to reduce reflections on a shared bus. Any deviation from the matched state causes a mismatch and results in reflections on the bus. These reflections harm the signal eye and decrease the ability of a DIMM to receive a transmitted signal. The negative impact of these reflections increases as more DIMMs are added to the shared bus—i.e., the net is increased. The embodiments herein reduce overall signal reflections by balancing the back reflections occurring at a connector junction coupled to a pair of resistors with the back reflections occurring at the input of the DIMMs. This balance (or tradeoff) is achieved by changing the resistance values of the pair of resistors to reduce the overall back reflections in the memory system.

In one embodiment, the pair of resistors coupled to the connector junction has the same resistive value. When a signal propagating along the shared bus reaches the connector junction, the current is split equally. Splitting the current equally improves the quality of the signal (i.e., the signal eye) at the input of the DIMMs.

In addition, near-end termination can be used to reduce back reflections at the input of the DIMM. From the perspective of the DIMM, the pair of resistors generates an impedance that is similar to the impedance of the shared bus. By optimizing the resistance value of the pair of resistors, the memory system balances between the amount of back reflection at the connector junction and at the input of the DIMM. As a result, the DIMMs may not need to use far-end termination in order to open up a signal eye which requires signal processing.

Figure 1:
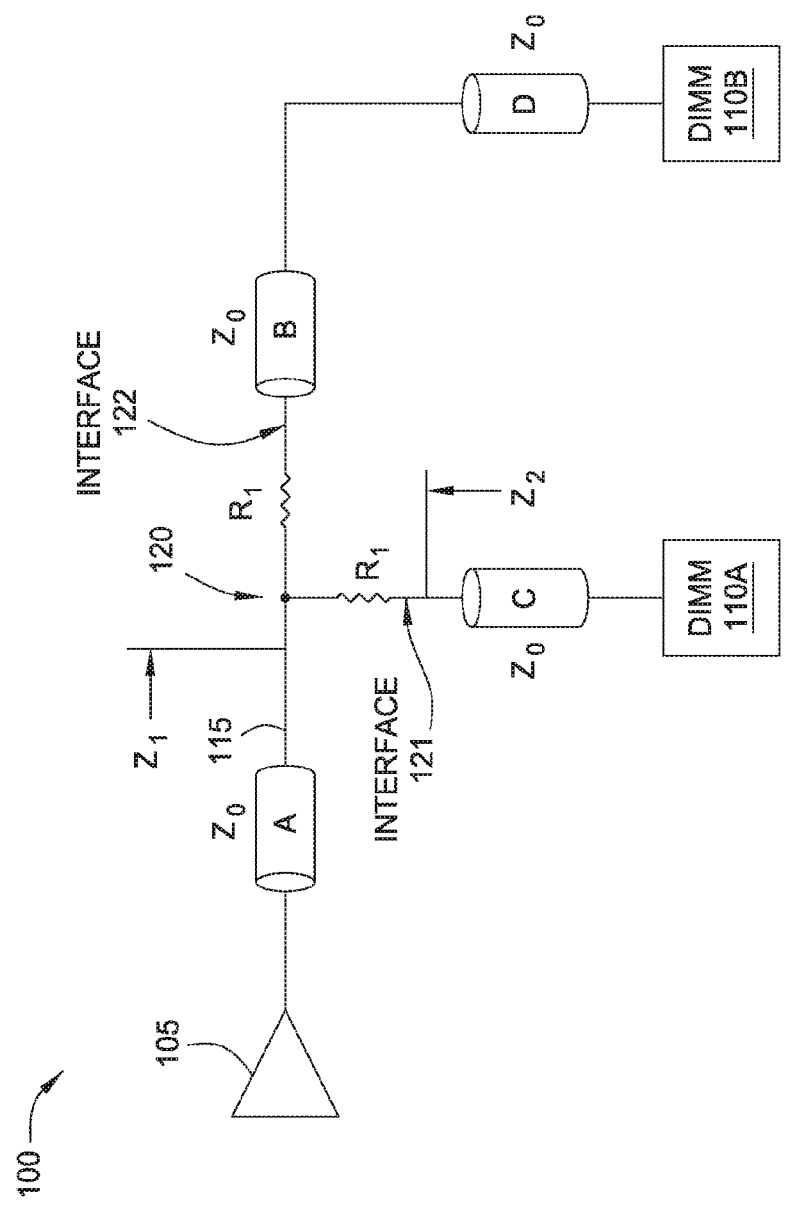
FIG. 1 is a circuit model of a DDR memory system with impedances to split the current equally, according to one embodiment described herein.

FIG. 1 is a circuit model of a DDR memory system 100 with impedances to split the current equally, according to one embodiment described herein. Memory system 100 includes a driver 105 coupled to two DIMMs 110 via a shared bus 115. The shared bus 115 includes a connector junction 120 where the signal outputted by the driver 105 is transmitted on two different branches. A first branch couples the shared bus 115 to DIMM 110A while a second branch continues along the shared bus 115 until reaching DIMM 110B. The first and second branch each includes a resistor R1 which are two discrete resistors but are labeled the same to indicate they have the same resistance value.

The output of the driver 105 sees an impedance of $Z_0$ which represents the inherent impedance of portion A of the shared bus 115. As a signal generated by the driver 105 propagates down the shared bus 115 towards the connector junction 120, the resistance seen by the signal remains $Z_0$. However, because of the physical structure of the connector junction 120, the impedance at this location on the shared bus 115 (i.e., impedance $Z_1$) is different. In this example, the connector junction 120 forms a "T" shaped connector which may cause back reflections—i.e., a portion of the signal may be reflected back towards the driver 105. These back reflections reduce the quality of the signal and may close an eye of the signal. In FIG. 1, the value of $Z_1$ is:

$$Z_1=(R_1+Z_0)\|(R_1+Z_0) \quad (1)$$

That is, the impedance seen by an AC signal at the junction 120 is the sum of the resistor $R_1$ and the impedance of portion B of the shared bus 115 (i.e., $Z_0$) which is in parallel with the sum of the resistor $R_1$ and the input impedance C of the DIMM 110A (i.e., $Z_0$). Assuming a value of 24 ohms for $R_1$ and 40 ohms for $Z_0$, the value of $Z_1$ is 32 ohms. Because this resistance does not precisely match the value of the resistance seen in the opposite direction—i.e., impedance $Z_0$ of portion A (40 ohms)—there is some back reflection at the connector junction 120. Of course, different resistance values for the resistors $R_1$ could be used to ensure there are no back reflections at junction 120. For example, if the resistors $R_1$ are 40 ohm resistors, then the impedance $Z_1$ perfectly matches the impedance $Z_0$ and there are no back reflections. However, as discussed below, the memory system 100 represents a tradeoff between the back reflections caused by connector junction 120 and the back reflections caused by terminating at the DIMMs 110.

In memory system 100, the current of a signal generated by the driver 105 is split evenly between the first and second branches of the junction 120. That is, the individual resistance of the branches (as seen by a signal at the junction 120) is the same—i.e., $R_1+Z_0$. In the case of the first branch which connects the shared bus 115 to the DIMM 110A, the impedance is the sum of the resistor $R_1$ and the input impedance C of the DIMM 110A. That is, in memory system 100 it is assumed that the DIMM 110A is directly coupled to the resistor R1 such that the impedance C represents the input impedance of the DIMM 110A. However, the result is the same even if a conductive trace is place between the resistor $R_1$ and DIMM 110A so long as the impedance of that trace is $Z_0$. Thus, from the perspective of an AC signal at the junction 120, the signal only sees the impedance of the resistor $R_1$ and $Z_0$, regardless of whether the DIMM 110A is directly coupled to the resistor or whether there is a conductive trace with an impedance of $Z_0$ between the resistor $R_1$ and the DIMM 110A.

In the second branch, the impedance is the sum of resistor $R_1$ and portion B of the shared bus 115 which has an impedance of $Z_0$. The input impedance D of the DIMM 110B, however, is not seen by AC signals at the connector junction 120, and thus, does not affect the impedance at the junction 120. Because the impedances of the two branches are the same, the current of the signal at the junction 120 is split evenly which optimizes the signal eye in both branches.

Memory system 100 also includes near end termination illustrated by impedance $Z_2$. For there to be no reflections at the input of the DIMM 110A, the impedance $Z_2$ should match the input impedance C of DIMM 110A—i.e., $Z_0$. $Z_2$ is expressed by Equation 2:

$$Z_2=((R_1+Z_0)\|Z_0)+R_1 \quad (2)$$

In Equation 2, the impedance $Z_2$ is defined by the impedance of portion A of the shared bus 115 which is in parallel with resistor $R_1$ and portion B of the bus 115. This combined resistance is in series with the resistor $R_1$ that is between DIMM 110A and the junction 120. Again assuming $R_1$ is 24 ohms and $Z_0$ is 40 ohms, the value of $Z_2$ is approximately 48.6 ohms. Like at junction 120, the mismatch between $Z_2$ (48.6 ohms) and $Z_0$ (40 ohms) causes some back reflection to occur when signals reach the input of DIMM 110A. However, the value of the resistors R1 are chosen to balance between the mismatches at the junction 120 and the input of the DIMM 110A. In contrast, if $R_1$ is 40 ohms, there is no back reflection at the junction 120. However, the value of $Z_2$ is approximately 67 ohms—a mismatch of 27 ohms relative to the 40 ohms input impedance C of the DIMM 110A. Thus, overall, the memory system 100 would have more back reflections and cause more harm to the signal eye when the resistor values are set to prevent back reflections at the junction 120 than the approach where the resistors permit a small amount of back reflection at the junction 120 and the input of DIMM 110A. Moreover, by balancing the resistor values to account for back reflections at these locations, the memory system 100 may avoid using any kind of far-end termination at the DIMMs 110 which relies on active signal processing to open up the signal eye. As used herein, "matching impedance" does not necessarily mean a perfect match where there are no back reflections, but rather includes optimizing resistance values so that the overall back reflections in a system when considering multiple impedances are reduced.

In one embodiment, the DIMMs 110 do not include any additional resistors in series with the input impedance of the DIMMs. For example, some DDR4 RDIMMs add a 15 ohm resistor in series with the memory modules on the DIMM to increase its input impedance. The DIMMs 110 in FIG. 1, however, do not include an additional resistor. In contrast, the two DIMM per channel (DPC) standard issued by the Joint Electron Device Engineering Council (JEDEC) uses 15 ohm resistors located on the DIMMs unlike memory system 100 where the resistors $R_1$ are disposed external to the DIMMs (e.g., on a motherboard). In a memory system designed using the DPC JEDEC standard, the resistors $R_1$ are omitted and the DIMMs 110 each includes internal 15 ohms resistors. In that case, the impedance $Z_1$ is expressed by:

$$Z_1=Z_0\|(15+Z_0) \quad (3)$$

Again assuming that $Z_0$ is 40 ohms, the value of $Z_1$ using Equation 3 is approximately 23 ohms, which results in significantly more back reflections at the junction 120 when compared to $Z_1$ shown in equation 1 with 40 ohms resistors $R_1$. Moreover, in the DPC JEDEC memory system, $Z_2$ is defined by:

$$Z_2=(Z_0\|Z_0)+15 \quad (4)$$

Thus, the impedance $Z_2$ when using the JEDEC standard is 35 ohms which is slightly better than the 48.6 ohms yielded by Equation 2 above (assuming $R_1$ is 24 ohms). However, overall, the performance of memory system 100 (which includes the resistors $R_1$ external to the DIMMs 110)

is better than the DPC JEDEC which may permit the memory system 100 to operate at higher speeds—e.g., speeds equal to or greater than 2667 Mb/sec. As explained above, the values of the resistors $R_1$ represent a compromise between the back reflections occurring at connector junction 120 and the back reflections occurring at the input of the DIMM 110A which minimizes the overall back reflection in the system. Moreover, the resistors $R_1$ enable the current to be split evenly at the junction 120 which does not occur using the DPC JEDEC.

In one embodiment, the values of resistors $R_1$ are less than the inherent impedance of the traces (i.e., $Z_0$) in the two branches coupled to the junction 120 and the input impedance on the DIMMs. For example, if resistor $R_1$ in the lower branch connects directly to DIMM 110A, then the resistive value is less than the input impedance C of the DIMM 110A (i.e., $Z_0$). Alternatively, a trace may couple the DIMM 110A to the resistor $R_1$, in which case the resistor $R_1$ may have a resistive value less than the inherent impedance of the trace. Similarly, portion B of the shared bus 115 coupling the resistor $R_1$ in the upper branch to the DIMM 110B may have an inherent impedance greater than the impedance of the resistor $R_1$. Setting the resistance values less than the impedance of the traces or the input of the DIMM 110A does result in some back reflection at junction 120. However, as explained above, reducing the value of the resistors $R_1$ also reduces the back reflection at the input of the DIMMs 110 which can reduce the overall back reflection and total noise in the memory system 100.

Figure 2:
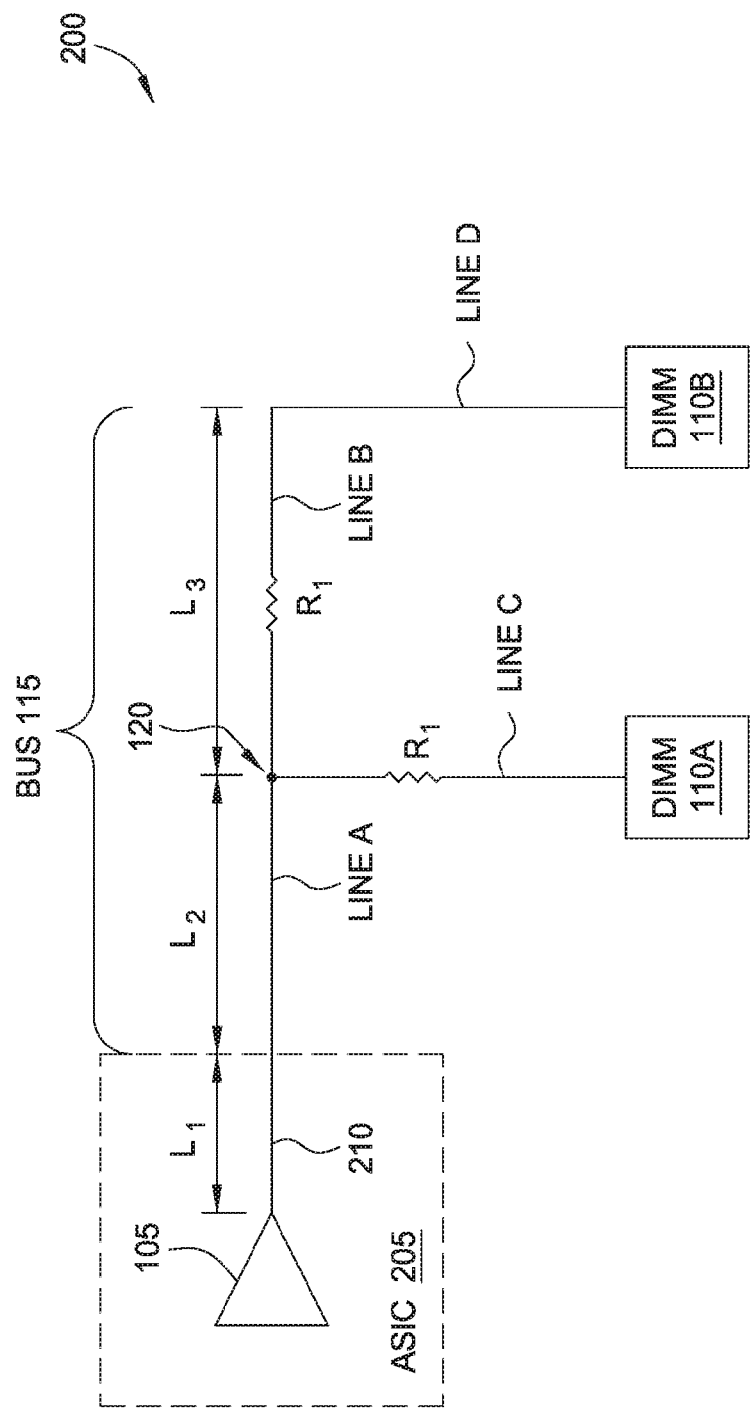
FIG. 2 is a circuit diagram of a memory system with impedances to split the current equally, according to one embodiment described herein.

FIG. 2 is a circuit diagram of a memory system 200 with impedances that split the current equally, according to one embodiment described herein. The memory system 200 includes an application specific integrated circuit (ASIC) 205 which includes the driver 105 and an internal trace 210. The ASIC 205 is coupled to the shared bus 115. For example, the ASIC may be soldered onto a motherboard which includes the shared bus 115. In one embodiment, the length $L_1$ of the internal trace may be between 10 and 30 mm. The length $L_2$ of Line A of the shared bus 115 between the ASIC 205 and the junction 120 may be less than or equal to seven inches, while the length $L_3$ of Line B may be less than or equal to 0.6 inches.

As shown, Line C connects the DIMM 110A to the resistor R1 and to the junction 120. In one embodiment, Line C may be short enough such that the DIMM 110A can be characterized as being directly coupled to the resistor R2. For example, Line C may be much less than half an inch—i.e., less than 5 mm. As such, the effects of line C on the signal may be ignored. For example, a signal at junction 120 may see the impedance of only the resistor R and the input impedance of DIMM 110A but not any impedance (or only a negligible amount of impedance) from Line C. Similarly, Line D which couples the DIMM 110B to the shared bus 115 may be much smaller than the length L3 of Line B—e.g., less than 5 mm. As such, from the perspective of the junction 120, the impedance is governed by the resistor R1 and the impedance of Line B while the impedance of Line D can be ignored.

Although not shown, Lines C and D may connect the shared bus 115 to respective DIMM connectors. More specifically, Lines C and D may terminate at respective connector leads in the DIMM connectors. As described below, the DIMMs 110 are inserted and aligned into the connectors such that the DIMMs 110 can transmit and receive data signals using the connector leads in the DIMM connectors.

Figure 3:
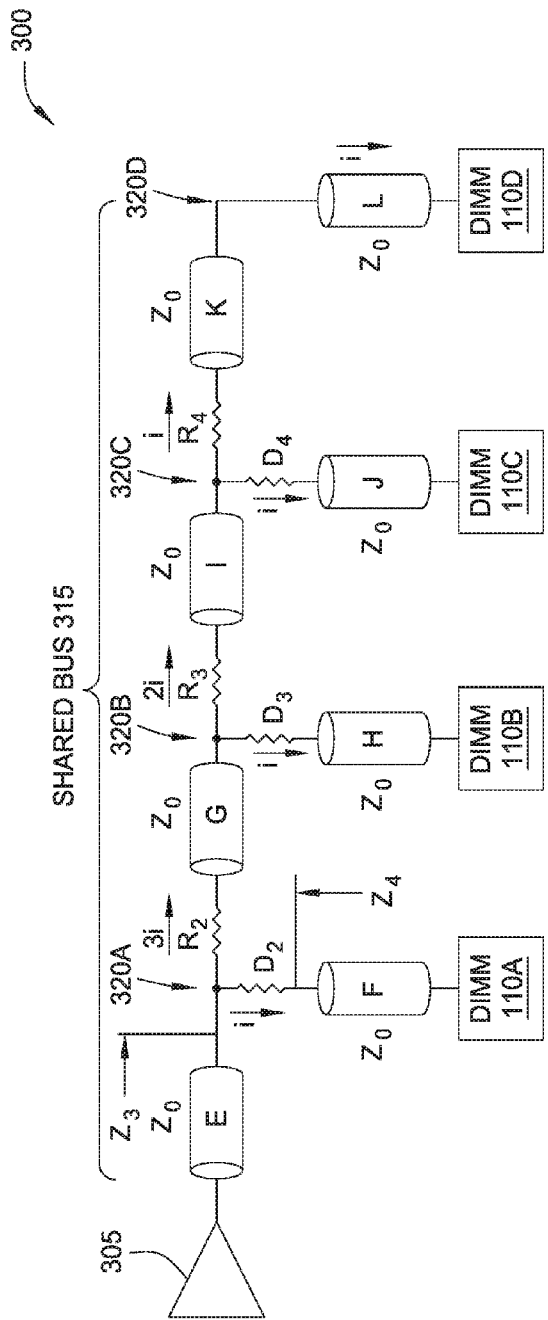
FIG. 3 is a circuit diagram of a memory system with multiple junctions, according to one embodiment described herein.

FIG. 3 is a circuit diagram of a memory system 300 with multiple junctions, according to one embodiment described herein. The system 300 includes a driver 305 coupled to a shared bus 315 which transmits output signals to the DIMMs 110. As shown, the shared bus 315 includes connector junctions 320 which each couple the bus 315 to a respective DIMM 110. The shared bus 315 includes a resistor disposed between each of the junctions 320. In addition, a resistor is disposed between the connector junctions 320 and the DIMMs 110.

Unlike FIGS. 1 and 2 where the resistors coupled to the connector junction are equal, in FIG. 3, the resistors directly coupled to the junctions 320 are unequal which means that the current flowing through the two branches of the junctions 320 are unequal. For example, the value of resistor $R_2$ may be a third of the value of resistor $D_2$ such that three times as much current (3 i) flows through resistor $R_2$ than through resistor $D_2$. Similarly, the resistor $R_3$ is a half of the value of resistor $D_3$ so that twice as much current flows through resistor $R_3$ than resistor $D_3$. Finally, the resistors $R_4$ and $D_4$ coupled to junction 320C may have the same resistance value since the current flowing through these resistors should be the same. In this manner, each of the branches flowing into the DIMMs 110 has the same current. Thus, the current of the signal at the DIMMs 110 does not decrease for the DIMMs 110 further away from the driver 305.

Moreover, the specific values of the resistors in the memory system 300 may be optimized to balance the reflections occurring at the junctions 320 with the reflections caused at the terminations of DIMMs 110A-C. For example, a circuit designer can change the values of the resistors $R_2$ and $D_2$ so that the impedance at junction 320A (i.e., $Z_3$) closely matches the impedance of portion E of the shared bus 115 and the impedance at the termination with DIMM 110A (i.e., $Z_4$) closely matches the input impedance F of the DIMM 110A. The impedances $Z_3$ and $Z_4$ are defined as:

$$Z_3 = (R_2 + Z_0) \| (D_2 + Z_0) \quad (5)$$

$$Z_4 = ((R_2 + Z_0) \| Z_0) + D_2 \quad (6)$$

In one embodiment, the specific values of resistors $R_2$ and $D_2$ are selected to match the values of $Z_3$ and $Z_4$ as closely as possible to $Z_0$. Stated differently, the value of resistors $R_2$ and $D_2$ are selected so that the total difference between $Z_3$, $Z_4$, and $Z_0$ is minimized. Nonetheless, the ratio between the resistors $R_2$ and $D_2$ is maintained where the value of resistor $D_2$ is three times as large as the value of resistor $R_2$ so that three times the current flows through $R_2$. A similar process can be performed for resistor pairs $R_3$ and $D_3$ and $R_4$ and $D_4$ to optimize these values and minimize the overall reflections in the memory system 300.

Note that at junction 320D, the termination may be ignored since there are no back reflections at its input since the impedance of portion K of the shared bus 315 (i.e., $Z_0$) is equal to the input impedance L of the DIMM 110D (i.e., $Z_0$).

In one embodiment, the impedance values of the transmission lines G, I, K are variable rather than being the same as shown in FIG. 3. For example, the line G may have impedance $Z_G$, line I has impedance $Z_I$, and line K has impedance $Z_K$. By changing the dimensions (e.g., cross sectional area) of the transmission lines G, I, and K, the circuit designer can control these impedances. To select values of the resistors (e.g., R2, D2, R3, D3, etc.) and the impedance values ($Z_G$, $Z_I$, and $Z_K$), a circuit designer may first select equal values for resistors R4 and D4 such that the impedance at the junction 320C closely matches the impedance $Z_I$ of transmission line I when resistor R4 is in series with transmission line K and resistor D4 is in series with transmission line J. The circuit designer can repeat this step for resistors R3 and D3 for junction 320B and for transmission lines I and H such that the current through resistor R3 is twice that through D3 and the parallel impedance of R3 plus $Z_I$ and D3 plus $Z_H$ matches the impedance $Z_G$ of transmission line G. The circuit designer repeats this process again to select values for resistors R2 and D2 for and for transmission lines G and F such that the current through resistor R2 is three times that through resistor D2 and the parallel impedance of R2 plus $Z_G$ and D2 plus $Z_F$ matches the impedance $Z_0$ of transmission line E which is typically matched to the impedance of the driver.

To optimize the values of the resistors R2-R4 and D2-D4, the impedance values of transmission lines G, I, and K may be adjusted using multiple simulations. During each simulation, one or more values of the resistors R2-R4 and D2-D4 or the impedances $Z_G$, $Z_I$, and $Z_K$ are changed. Each simulation results in four eyes at each of the DIMMs 110. For each simulation, the simulator measures the openings of each of the four eyes and determines the eye with the smallest opening. In addition, for each simulation, the simulator determines the average opening of the four eyes and adds this average value to the opening of the smallest eye. For example, if the smallest eye has an opening of 150 ps and the average opening for the four eyes is 180 ps, than the combined value is 330 ps. Once all the desired simulations are performed, the simulation compares the summations of the average opening and the minimum opening for all the simulations to determine the summation with the maximum value. The values of the resistor values of R2-R4 and D2-D4 and impedance values $Z_G$, $Z_I$, and $Z_K$ used in the simulation that resulted in the maximum value are used to design the four DIMM 110 system shown in FIG. 3.

Figure 4:
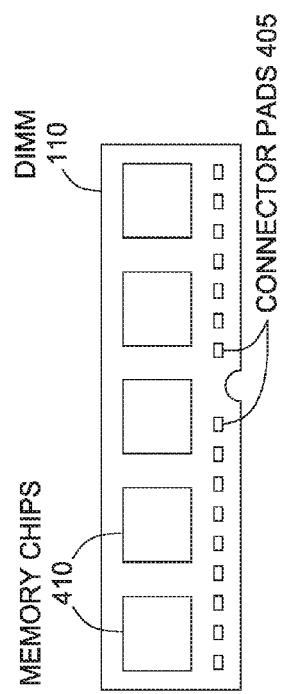
FIG. 4 is a DIMM, according to one embodiment described herein.

FIG. 4 is a DIMM 110, according to one embodiment described herein. The DIMM 110 includes a plurality of connector pads 405 that are electrically coupled to one of a plurality of memory chips 410. Using the connector pads 405, a memory system can access data written on the memory chips 410 as well as write new data into the chips 410. The memory chips 410 may be SRAM or DRAM. Although not shown, the DIMM 110 includes another row of connector pads 405 disposed on a side opposite the one shown here. These connectors pads are also coupled to the memory chips 410.

FIG. 5A is a motherboard 500 with multiple DIMM connectors 505, according to one embodiment described herein. The DIMM connectors 505 each include a plurality of connector leads 510 which correspond to a respective one of the connector pads 405 illustrated in FIG. 4. Stated differently, when properly aligned in the DIMM connector 505, each of the connector pads 405 on a DIMM contact a respective one of the connector leads 510 in the DIMM connector 505, thereby establishing electrical communication between the motherboard 500 and the DIMM 110. Each DIMM connector 505 includes two columns of connector leads 510 for coupling to connector pads on respective sides of the DIMM when inserted into the connector 505.

The motherboard includes drivers 105A and 105B for driving signals to the DIMMs using the connector leads 510. Although shown in different locations on the motherboard 500, the drivers 105 may be located on the same ASIC or on different ASICs mounted onto the motherboard 500. Each driver 105 uses a shared bus 115 to drive data signals to each one of the DIMM connectors 505, or more specifically, to drive data signals to a respective one of the connector leads 510 on each of the DIMM connectors 505. The arrangement of the drivers 105, shared bus 115, and resistors $R_1$ may be equivalent to the circuit model illustrated in FIG. 1. As such, the current outputted by driver 105 is split equally between the two branches of the connector junctions 120 such that half of the current goes to DIMM connector 505A and the remaining half to DIMM connector 505B. Although not shown in FIG. 5A, one of the branches may be much longer than the other. For example, the length of the shared bus 115 between the rightmost resistor $R_1$ and the DIMM connector 505B (which corresponds to junction 121 shown in FIG. 1) may be much greater than the distance between the leftmost resistor $R_1$ and the DIMM connector 505A (which corresponds to junction 122 shown in FIG. 1). As described above, by optimizing the resistance values of the resistors $R_1$, the back reflections at the junction 120 and at DIMM connector 505A (i.e., the DIMM connector closest to the junction 120) may be reduced.

In one embodiment, the resistors $R_1$ may be disposed on a surface on the motherboard 500 opposite the surface on which the DIMM connectors 505 are disposed. For example, the drivers 105 drive signals onto the buses 115 which may be formed using traces internal to the motherboard 500 (e.g., within a PCB) or traces mounted on an external surface of the motherboard 500. Using vias, the buses 115 are connected to the resistors $R_1$ at the junctions 120. For example, a via may electrically connect bus 115 to a bottom side of the motherboard 500 where the resistors $R_1$ are disposed. The resistors $R_1$ can be coupled to other vias that route the electrical signal to the side of the motherboard 500 that includes the DIMM connectors 505, thereby better utilizing the real estate of the motherboard 500. However, in another embodiment, the DIMM connectors 505 and the resistors $R_1$ may be located on the same side of the motherboard 500.

Figure 5B:
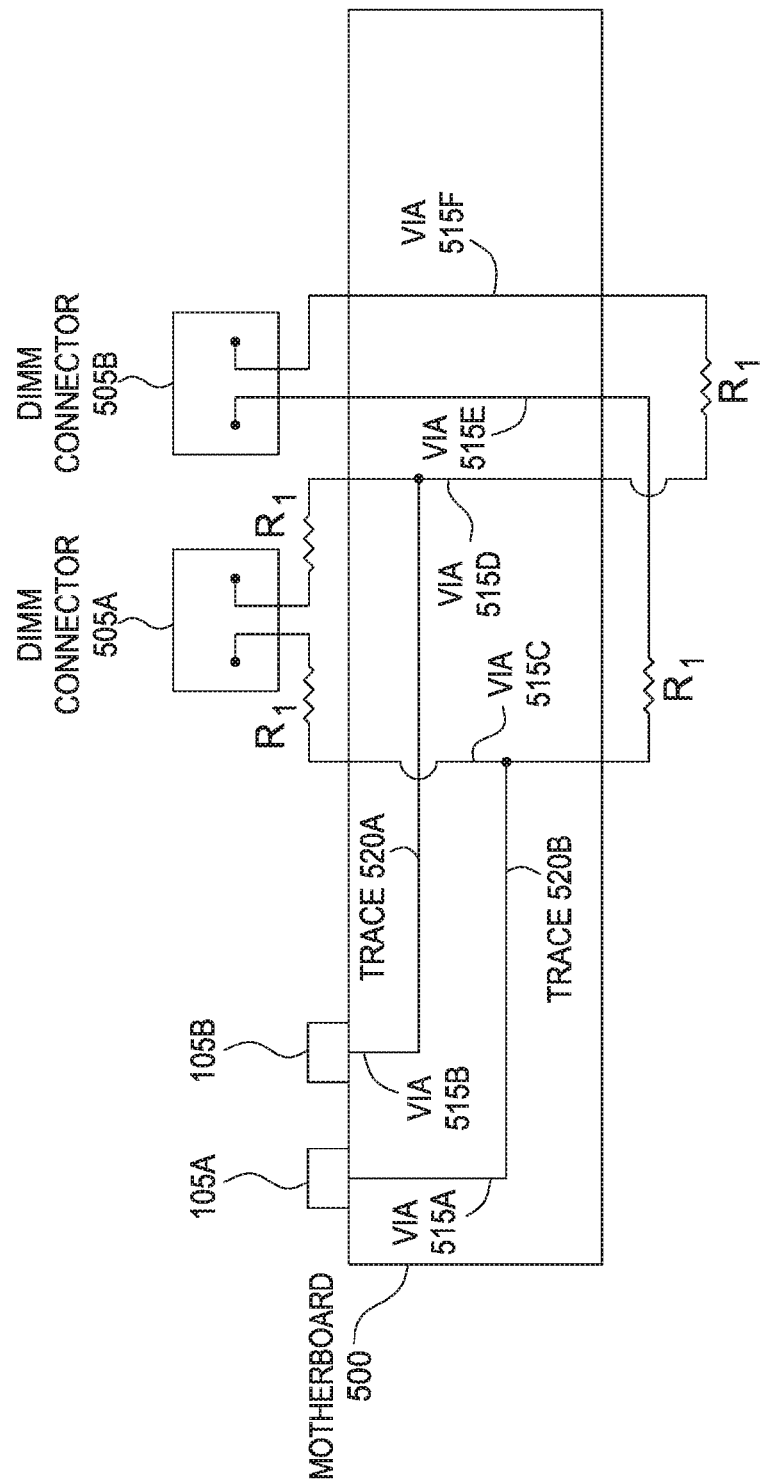

FIG. 5B illustrates a cross-sectional view of the motherboard 500. As shown, the drivers 105 are disposed on a top surface of the motherboard 500, but in other embodiments may be located on a bottom surface. Using vias 515A and 515B, the signals driven by the drivers 105 are transmitted on traces 520A and 520B which are internal to the motherboard 500—e.g., the traces 520 are between the bottom and top outer surfaces of the motherboard 500. The traces 520 may be located on a same layer or multiple layers within the motherboard 500.

The through vias 515C and 515E route signals transmitted by driver 105A into the DIMM connectors 505, while through vias 515D and 515F route signals transmitted by driver 105B into the DIMM connectors 505. The through vias 515C and 515D are connected to two resistors R1 on opposite ends where one resistor is mounted on the top surface and the other is mounted on the bottom surface of the motherboard. The circuit shown in FIG. 5B is logically equivalent to the circuit shown in FIG. 5A.

FIG. 6 is a motherboard 600 with multiple DIMM connectors 605, according to one embodiment described herein. That is, the DIMM connectors 605A-D each includes a connector lead 610 for coupling to a connector pad in a respective DIMM. As shown, the motherboard 600 has a similar circuit model as the memory system 300 illustrated in FIG. 3, and as such, the values of the resistors $R_{2-4}$ and $D_{2-4}$ are set to ensure each connector lead 610 receives an equal amount of current. Stated differently, the current provided by the driver 305 is split equally among the four DIMM connectors 605. However, except for resistors $R_4$ and $D_4$, the values of the resistor pairs may vary. For instance, resistor $R_2$ may have a value that is three times the resistance of resistor $D_2$, while resistor $R_3$ has a value that is twice the resistance of $D_3$. Although this results in back reflection at the junctions connecting the resistor pairs and at the DIMM connectors 605 (i.e., the inputs of the DIMMs), the overall back reflection and noise in the system may be reduced relative to a motherboard arrangement where the values of the resistor $R_{2-4}$ and $D_{2-4}$ were chosen such that there is no reflection at the junctions.

As with motherboard 500, the resistors $R_{2-4}$ and $D_{2-4}$ may be disposed on a different surface of the motherboard 600 than DIMM connectors 605. For example, the resistors $R_{2-4}$ and $D_{2-4}$ may be disposed on the backside of the motherboard 600 while the DIMM connectors 605 are disposed on the front side. The motherboard 600 may include multiple vias that couple the resistors $R_{2-4}$ and $D_{2-4}$ to the DIMM connectors 605 and the drivers 305.

For the sake of clarity, only two connector leads 610 are shown on each of the DIMM connectors 605. However, the DIMM connectors 605 will typically include approximately the same number of connector leads 610 as the connector pads on the DIMMs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A memory system, comprising:
   a driver;
   a conductive trace coupled to an output of the driver at a first end and to a connector junction at a second end;
   a first discrete resistor coupled to the connector junction at a first end and a first connector lead at a second end, wherein the first connector lead is configured to couple to a first memory module;
   a second discrete resistor coupled to the connector junction at a first end and a second connector lead at a second end, wherein the second connector lead is configured to couple to a second memory module, wherein resistive values of the first and second resistors are the same, and wherein the resistive values of the first and second resistors result in back reflections at the connector junction when the driver transmits a signal to the first and second connector leads;
   a third discrete resistor coupled to the connector junction at a first end and a second connector junction at a second end, wherein the third resistor is disposed between the connector junction and the driver;
   a fourth discrete resistor coupled to the second connector junction at a first end and a third connector lead at a second end, wherein the third connector lead is configured to couple to a third memory module, and
   wherein a resistance value of the first resistor is an integer multiple of a resistance value of the fourth resistor.

2. The memory system of claim 1, wherein the resistive values of the first and second resistors are less than an inherent resistance of a second conductive trace coupling the second end of the first resistor to the first connector lead.

3. The memory system of claim 2, wherein the resistive values of the first and second resistors are less than input resistances of the first and second memory modules, wherein the resistive values result in back reflections at an input of at least one of the first and second modules.

4. The memory system of claim 1, further comprising:
   a second conductive trace coupled between the second end of the second resistor and the second connector lead, and
   wherein there are no other discrete resistors disposed between the connector junction and first connector lead besides the first resistor, and wherein there are no other discrete resistors disposed between the connector junction and the second connector lead besides the second resistor.

5. The memory system of claim 1, wherein at least one of the resistance values of the third and fourth resistors is different than the resistance values of the first and second resistors.

6. The memory system of claim 1, wherein, when a signal is outputted by the driver, currents flowing through the first and second resistors are the same but currents flowing through the third and fourth resistors are different.

7. The memory system of claim 1, wherein the first connector lead is disposed in a first dual-in memory module (DIMM) connector and the second connector lead is disposed in a second DIMM connector, and wherein the first and second DIMM connectors and the first and second resistors are disposed on a motherboard.

8. A memory system, comprising:
   a driver;
   a first conductive trace coupled to an output of the driver at a first end and to a connector junction at a second end;
   a first discrete resistor coupled to the connector junction at a first end and a first connector lead at a second end, wherein the first connector lead is configured to couple to a first memory module;
   a second discrete resistor coupled to the connector junction at a first end and a second connector lead at a second end, wherein the second connector lead is configured to couple to a second memory module, wherein resistive values of the first and second resistors are the same, wherein the resistive values of the first and second resistors are less than an inherent resistance of a second conductive trace coupling the second end of the first resistor to the first connector lead;
a third discrete resistor coupled to the connector junction at a first end and a second connector junction at a second end, wherein the third resistor is disposed between the connector junction and the driver;
a fourth discrete resistor coupled to the second connector junction at a first end and a third connector lead at a second end, wherein the third connector lead is configured to couple to a third memory module, and wherein a resistance value of the first resistor is an integer multiple of a resistance value of the fourth resistor.

9. The memory system of claim 8, wherein the resistive values of the first and second resistors result in back reflections at the connector junction when the driver transmits a signal to the first and second connector leads.

10. The memory system of claim 8, wherein the resistive values of the first and second resistors are less than input resistances of the first and second memory modules, wherein the resistive values result in back reflections at an input of at least one of the first and second modules.

11. The memory system of claim 8, wherein, when a signal is outputted by the driver, currents flowing through the first and second resistors are the same but currents flowing through the third and fourth resistors are different.

12. A memory system, comprising:
a substrate, comprising:
a driver,
a conductive trace coupled to an output of the driver at a first end and to a connector junction at a second end;
a first discrete resistor coupled to the connector junction at a first end and a first connector lead at a second end, wherein the first connector lead is disposed in a first DIMM connector;
a second discrete resistor coupled to the connector junction at a first end and a second connector lead at a second end, wherein the second connector lead is disposed in a second DIMM connector, and wherein resistive values of the first and second resistors are the same, wherein the resistive values of the first and second resistors result in back reflections at the connector junction when the driver transmits a signal to the first and second DIMM connectors;
a first memory module inserted into the first DIMM connector; and
a second memory module inserted into the second DIMM connector;
a third discrete resistor coupled to the connector junction at a first end and a second connector junction at a second end, wherein the third resistor is disposed between the connector junction and the driver;
a fourth discrete resistor coupled to the second connector junction at a first end and a third DIMM connector at a second end, wherein the third connector lead is coupled to a third memory module, and wherein a resistance value of the first resistor is an integer multiple of a resistance value of the fourth resistor.

13. The memory system of claim 12, wherein the first and second resistors are disposed on a first surface of the substrate that is opposite a second surface of the substrate on which the first and second DIMM connectors are disposed.

14. The memory system of claim 12, wherein the resistive values of the first and second resistors are less than an inherent resistance of a second conductive trace coupling the second end of the first resistor to the first DIMM connector.

15. The memory system of claim 14, wherein the resistive values of the first and second resistors are less than input resistances of the first and second memory modules, wherein the resistive values result in back reflections at an input of at least one of the first and second modules.

16. The memory system of claim 12, wherein, when a signal is outputted by the driver, currents flowing through the first and second resistors are the same but currents flowing through the third and fourth resistors are different.

17. A memory system, comprising:
a driver;
a conductive trace coupled to an output of the driver at a first end and to a connector junction at a second end;
a first discrete resistor coupled to the connector junction at a first end and a first connector lead at a second end, wherein the first connector lead is configured to couple to a first memory module;
a second discrete resistor coupled to the connector junction at a first end and a second connector lead at a second end, wherein the second connector lead is configured to couple to a second memory module, wherein resistive values of the first and second resistors are the same, and wherein the resistive values of the first and second resistors result in back reflections at the connector junction when the driver transmits a signal to the first and second connector leads;
a second driver;
a second conductive trace coupled to an output of the second driver and a second connector junction;
a third discrete resistor coupled to the second connector junction at a first end and a third connector lead at a second end; and
a fourth discrete resistor coupled to the second connector junction at a first end and a fourth connector lead at a second end, wherein the first, second, third, and fourth resistors have the same resistive values, and wherein the first and third connector leads are disposed in a first DIMM connector and the second and fourth connector leads are disposed in a second DIMM connector.

* * * * *